United States Patent [19]

Merriman

[11] 4,214,214

[45] Jul. 22, 1980

[54] CONNECTING CABLE

[76] Inventor: George W. Merriman, 90 Pierrepont St., Brooklyn, N.Y. 11201

[21] Appl. No.: 930,644

[22] Filed: Aug. 3, 1978

[51] Int. Cl.$^2$ .............................................. H03F 3/16
[52] U.S. Cl. .................................... 330/65; 330/277; 330/297
[58] Field of Search ................... 330/65, 68, 277, 297, 330/300; 84/1.14; 361/392; 179/1 PC, 1 A

[56] References Cited

U.S. PATENT DOCUMENTS

| | | | |
|---|---|---|---|
| 2,929,877 | 3/1960 | Irick | 179/1 A |
| 3,501,711 | 3/1970 | Moran | 330/300 X |
| 3,662,223 | 5/1972 | Marshall | 330/65 X |
| 3,743,784 | 7/1973 | Sato | 179/1 PC |
| 3,961,202 | 6/1976 | Kono et al. | 179/1 A X |

OTHER PUBLICATIONS

Jones, "Microphone Preamp Gets Power Through Signal Cable", *Electronics*, Jun. 26, 1975, p. 94.

*Primary Examiner*—James B. Mullins
*Attorney, Agent, or Firm*—Kenyon & Kenyon

[57] ABSTRACT

A connecting cable comprising a length of coaxial cable having at one of its ends an input plug connector whose first and second input terminals are adapted to connect to the electrical output terminals of a pickup of a musical instrument, and means comprising a field effect transistor connected in the circuit of the cable and connector and housed within the connector.

11 Claims, 3 Drawing Figures

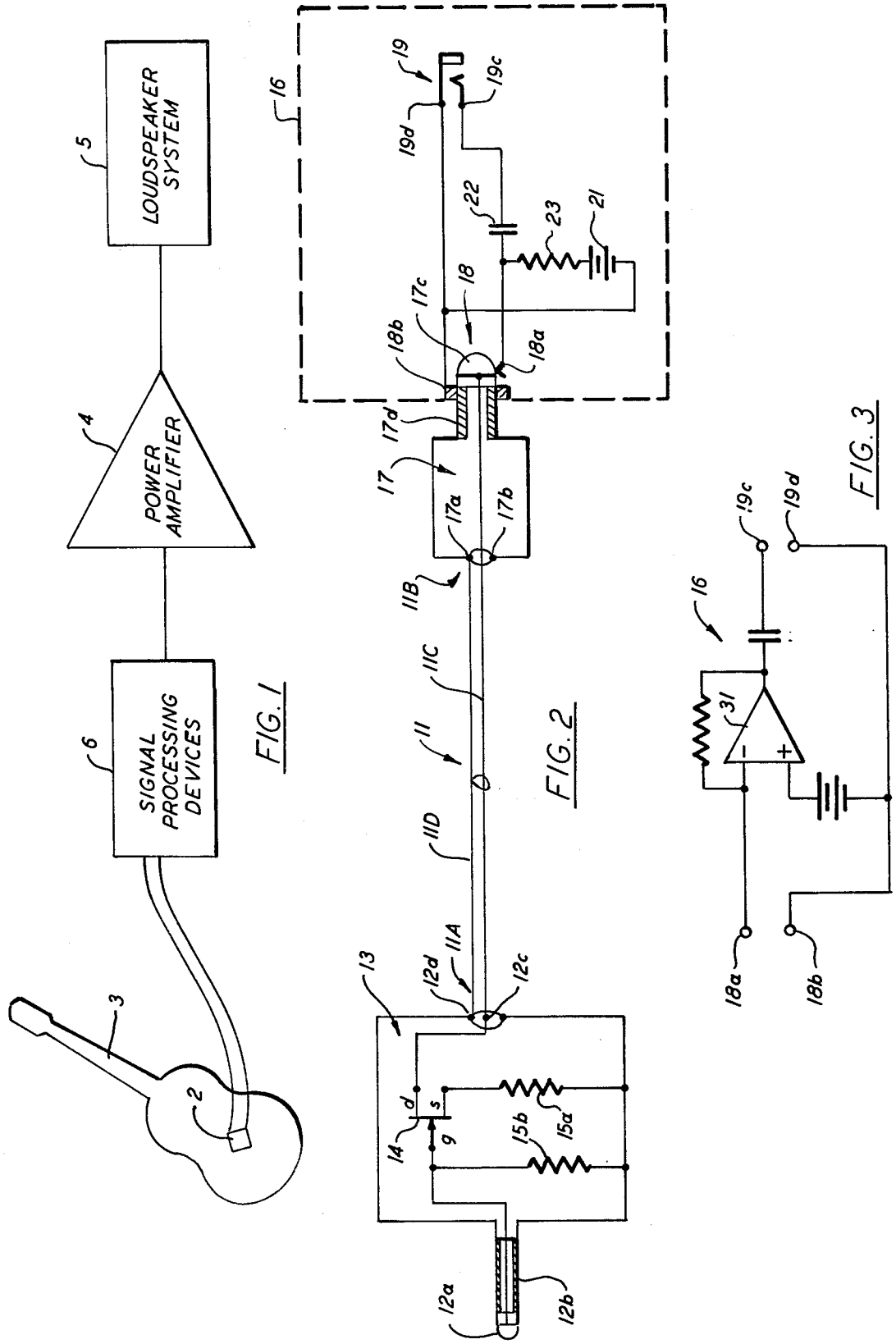

CONNECTING CABLE

BACKGROUND OF THE INVENTION

This invention pertains to connection cables and, in particular, to connection cables for connecting electrical instruments to their associated loads, i.e., amplifiers, processing equipment etc.

Many electrical instruments such as, for example, electric guitars, employ magnetic transducers for converting the sound vibrations or energy from the instrument into electrical signals for further signal processing and amplification. These transducers, or pickups, as they are commonly referred to are generally of the variable reluctance type and each exhibits a pronounced self-resonance effect giving the pickup its own characteristic sound. Musicians find this self-resonance effect and resultant pickup sound highly desirable, but it is often obscured by the equipment connected to the pickup, i.e., the connecting cable as well as the processing and amplification devices. In particular, the input impedance of the latter devices is often so low that the devices cause an undesirable shunting of the pickup electrical signal. A similar shunting effect is found to result from the connecting cable, this effect being especially pronounced in cables which are required to be long in length due to the requirements of the musician. In any case, this shunting effect results in loss of high frequency energy, thereby dampening the pickup resonance effect and producing what is commonly referred to as a "muddy sound."

Various attempts have been made in the past to prevent this undesirable shunting of the signal from the pickups of electrical instruments. Thus, for example, in the case of electric guitars, pre-amplification circuitry has been incorporated into the guitar body so that a low impedance output is provided by the instrument. Guitars of this type, however, require battery power or a special cable and power supply. As a result, they are expensive and overly complex and, hence, have not gained widespread acceptance by musicians. Attempts at providing kits for adding preamplification to existing guitars have also faced similar difficulties and, in addition, musicians are reluctant to use these kits as they fear they might disturb the other characteristics of their instruments. Miniature self-contained preamplifiers for plugging directly into the guitar have also been designed, but these have been found awkward to use and, hence, undesirable. Finally, various low loss cables have been designed and manufactured but these cables suffer from mechanical problems such as stiffness and large size.

It is, therefore, an object of the present invention to provide a connecting means for use with the pickup of an electrical instrument, which does not provide signal shunting of the pickup signal.

It is a further object of the present invention to provide a connecting cable for the pickup of an electrical instrument which is compact, inexpensive, provides a high input impedance and is compatible with existing equipment.

SUMMARY OF THE INVENTION

In accordance with the principles of the present invention, the above and other objectives are realized in a connecting cable comprising a length of coaxial cable having at one of its ends an input plug connector whose first and second input terminals are adapted to connect to the electrical output terminals of the pickup of the musical instrument, and means comprising a field effect transistor connected in the circuit of the cable and connector and housed within the connector. The presence of the field effect transistor within the circuit of the cable and connector causes the impedance presented by the circuit at the electrical output terminals of the instrument pickup to be relatively high. The circuit thus has a minimal shunting effect on the output signal from the pickup and the pickup resonance effect is, therefore, preserved.

The field effect transistor is preferably connected in the cable and connector circuit with its gate terminal connected to the first input terminal of the input connector and its drain terminal connected to a first output terminal of the input connector. The source terminal of the transistor, in turn, is connected to the second input terminal of the connector, which terminal also serves as the second output terminal of the connector. The central conductor of the coaxial cable is connected to the first output terminal, while the other conductor or shield of the coaxial cable is connected to the second output terminal. Also, preferably, resistive means is further provided for the connecting cable in the form of a first resistor connected between the gate terminal of the field effect transistor and the second input connector terminal and a second resistor connected between the latter terminal and the source terminal of the transistor.

The other or output end of the coaxial cable of the invention is further adapted to be connected to a circuit module for providing power to the field effect transistor. The aforesaid circuit module may be built directly into the equipment to be supplied by the connecting cable with the musical instrument output. Alternatively, this module may be in a separate unit which connects to such equipment. Preferably, an output plug connector similar to the input plug is provided at the output end of the coaxial cable to effect its connection to the circuit module.

In a further aspect of the invention, a specific circuit module is provided which comprises a housing and capacitive, resistive and power supply means housed within the housing. In the particular module to be disclosed hereinafter, the housing is in the form of a mating plug connector adapted to mate with the output connector of the cable. Both the resistive means and capacitive means are connected to a first input terminal of this mating plug connector, this first input terminal being connected to the terminal of the output plug connector connected to the central coaxial conductor. The other end of the resistive means is connected to the power supply means, while the other end of the capacitive means is connected to a first output terminal of the mating connector. A second output terminal of the mating connector connects to the other end of the supply means. This output terminal also connects to a second input terminal of the mating connector which, in turn, connects to the output plug connector terminal connected to the other conductor or shield of the coaxial cable.

BRIEF DESCRIPTION OF THE DRAWINGS

The above and other features and aspects of the present invention will become more apparent upon reading the following detailed description, in conjunction with the accompanying drawings, in which:

FIG. 1 shows a connecting cable for connecting an instrument to a load and configured in accordance with the principles of the present invention;

FIG. 2 shows the details of the connecting cable of FIG. 1; and

FIG. 3 shows a modification of the power supply means of FIG. 2.

DETAILED DESCRIPTION

FIG. 1 shows a connecting cable 1 in accordance with the principles of the present invention. The cable 1 is being used to connect the electrical pickup 2 of an electric guitar 3 to a power amplifier 4 which feeds a speaker system 5. As shown, a number of signal processing devices 6 are connected between the output end of the cable 1 and the power amplifier 4, but depending upon the application, these devices need not be employed and the cable output can be connected directly to the amplifier 4.

In accordance with the invention, the connecting cable 1 couples the electrical signal at the output terminals of the pickup 2 to the equipment 4, 5 and 6. More particularly, as shown in FIG. 2, the connecting cable 1 comprises a length of coaxial cable 11 having a plug connector 12 connected to one of its ends 11A. As shown, the input connector 12 comprises a conventional male phone plug whose first and second input terminals 12a and 12b connect to the output terminals of the pickup 2. Disposed within the circuit formed by the coaxial cable 11 and input connector 12 and housed with the connector 12 is an inverter means 13 comprised of a field effect transistor 14.

The field effect transistor 14 has gate and source terminals g and s and a drain terminal d. The gate terminal g is connected directly to the input terminal 12a of the connector 12, while the drain terminal d is connected directly to a first output terminal 12c of the connector. The source terminal s of the transistor, in turn, is connected through a first resistor 15a to the second output terminal 12d of the connector, this terminal of the connector also being connected directly to the second input terminal 12b. A second resistor 15b is further connected between the latter terminal and the gate terminal g.

The central conductor 11C and the other conductor or shield 11D of the coaxial cable at the input end 11A connect respectively, to the output terminals 12c and 12d of the connector 12. The output end 11B of the coaxial cable, in turn, is adapted to be connected to a means 16 for providing power to the field effect transistor 14. The means 16 may be either built directly into the equipment (i.e., the device 6 or power amplifier 4) being fed by the cable 1 or, as shown, may be a circuit module separate from this equipment, but connectable thereto. In either case, it is advantageous to provide the output end 11B of the coaxial cable 11 with a conventional output phone plug connector 17 for effecting connection of the cable end with the supply means 16.

As can be appreciated with the field effect transistor 14 in the circuit of the coaxial cable 11 and connector 12, the impedance seen by the pickup 2 of the instrument 3 is determined by the input impedance of the transistor. Since the input impedance of the transistor is determined by the resistance 15b which, typically, is of the order of 1 mega ohm, the impedance seen by the pickup will be high relative to the pickup impedance, which is typically, of the order of 100 kilo ohms. As a result, the cable 1 will effect minimal shunting of the pickup signal in carrying the signal from the pickup to the devices 6 and amplifier 4. The desirable self resonance effect of the pickup will thus be preserved by the cable 1 and, hence, will be present in the sound from the system 5.

As above noted, the supply means 16 may be a separate circuit module which is adapted to connect to the output connector 17. In accordance with a further aspect of the invention, the means 16 comprises a conventional female jack connector 18 adapted to mate with the conventional output male phone plug connector 17. In particular, the jack connector 18 has first and second input terminals 18a and 18b which connect with the first and second output terminals 17c and 17d of the connector 17. The terminals 17c and 17d directly connect to the first and second input terminals 17a and 17b of the connector, these two terminals being connected to the coaxial conductors 11C and 11D. The means 16 is further provided with a jack 19 and with a power source 21 which is connected through a resistor 23 to the first input terminal 18a. This power source and resistor combination supply power to the drain terminal d of the transistor 14 through the path 18a, 17c, 11c and 12e. A capacitor 22 is further provided in module 16 and is connected between the first input terminal 18a and a first jack output 19. The output from the jack appears across the latter terminal and a second jack output terminal 19 connected to the first input terminal 18b. As above noted, due to the minimum shunting effect of the cable 1, the output appearing across the terminals 19c and 19d will be a faithful reproduction of the pickup signal output and, hence, will manifest the desirable resonance effect of the pickup.

It should be noted that in the embodiment of the means 16 in FIG. 2, the transistor 14 can be adjusted by suitable adjustment of the resistor 21 to achieve unity gain as well as higher gains. Alternatively, for realizing still higher gains, the means 16 can be modified so as to incorporate an operational amplifier into the jack connector 18. FIG. 3 shows such a modified arrangement with a conventional operational amplifier 31 provided in the jack circuit and connected to the jack terminals as shown.

What is claimed is:

1. A connecting cable for connecting an electric pickup of a musical instrument with output terminals to a load, said connecting cable comprising:
   (a) a coaxial cable having a central conductor and a further conductor;
   (b) an input connector comprising a conventional male phone plug having first and second input terminals adapted to be connected to the output terminals of said pickup, and first and second output terminals connected to the central and further conductors of said coaxial cable respectively;
   (c) a single transistor, in the form of a field effect transistor having a source, a drain and a gate terminal, said gate terminal connected to said first input terminal and said drain terminal connected to said first output terminal, disposed within said conventional male phone plug; and
   (d) an output connector connected to the other end of said coaxial cable.

2. A connecting cable in accordance with claim 1 wherein: said input connector is a male phone plug.

3. A connecting cable in accordance with claim 1 wherein: said output connector is a male phone plug.

4. A connecting cable in accordance with claim 1 further comprising:
   a first resistor for connecting said source terminal to said second output terminal; and
   a second resistor connected between said gate terminal and said second input terminal.

5. A connecting cable in accordance with claim 4 wherein:
   said second input terminal is connected to said second output terminal.

6. Apparatus for connecting an electrical pickup of a musical instrument with output terminals to a load comprising:
   (a) a connecting cable for receiving a signal from said pickup comprising:
      (i) a coaxial cable having a central conductor and a further conductor;
      (ii) an input connector comprising a conventional male phone plug having first and second input terminals adapted to be connected to the output terminals of said pickup and first and second output terminals connected to the central and further conductors of said coaxial cable respectively;
      (iii) a single transistor, in the form of a field effect transistor having a source, a drain and a gate terminal, said gate terminal connected to said first input terminal and said drain terminal connected to said first output terminal, disposed within said conventional male phone plug; and
      (iv) an output connector connected to the other end of said coaxial cable; and
   (b) means connected to said output connector for supplying power to said transistor.

7. Apparatus in accordance with claim 6 wherein:
   said means for supplying power comprises a separate module including a further connector configured to mate with said output connector.

8. Apparatus in accordance with claim 7 wherein:
   said supply means further comprises a power supply housed within said module.

9. Apparatus in accordance with claim 8 wherein:
   said output connector has third and fourth input terminals connected to said central conductor and said other conductor of said coaxial cable, respectively, and third and fourth output terminals connected to said third and fourth input terminals;
   said mating connector has fifth and sixth input terminals connected to said third and fourth output terminals, respectively;
   said module having a further output connector with fifth and sixth output terminals; and
   said power supply is connected between said fifth and sixth input terminals and said fifth and sixth output terminals.

10. Apparatus in accordance with claim 9 wherein said means for supplying power comprises:
    a power source;
    a resistor connected between said power source and said fifth input terminal;
    and a capacitor connected between said fifth input terminal and said fifth output terminal.

11. Apparatus in accordance with claim 9 wherein said means for supplying power comprises:
    an operational amplifier having an inverting and a noninverting input and an output;
    a feedback resistor between said output and inverting input;
    biasing means coupled between said sixth input terminal and said noninverting input;
    said inverting input coupled to said fifth input terminal;
    a capacitor coupling said output to said fifth output terminal; and
    said sixth output terminal connected to said sixth input terminal.

* * * * *